US012666899B2

(12) United States Patent
Grootegoed et al.

(10) Patent No.: US 12,666,899 B2
(45) **Date of Patent: \*Jun. 23, 2026**

(54) WAFER CLEANING METHOD AND SYSTEM

(71) Applicant: Tokyo Electron Limited, Tokyo (JP)

(72) Inventors: James Grootegoed, Albany, NY (US);
Ronald Nasman, Albany, NY (US);
Peter Delia, Albany, NY (US)

(73) Assignee: Tokyo Electron Limited, Tokyo (JP)

( * ) Notice: Subject to any disclaimer, the term of this
patent is extended or adjusted under 35
U.S.C. 154(b) by 34 days.

This patent is subject to a terminal dis-
claimer.

(21) Appl. No.: 18/666,319

(22) Filed: May 16, 2024

(65) Prior Publication Data

US 2025/0357099 A1      Nov. 20, 2025

(51) Int. Cl.
H10P 72/00          (2026.01)
H10P 70/00          (2026.01)

(52) U.S. Cl.
CPC .......... H10P 72/0408 (2026.01); H10P 70/18
(2026.01); H10P 72/0411 (2026.01)

(58) Field of Classification Search
CPC ........................................ H10P 72/0406–0416
See application file for complete search history.

(56) References Cited

U.S. PATENT DOCUMENTS

| | | | | | |
|---|---|---|---|---|---|
| 5,371,950 | A | * | 12/1994 | Schumacher | ..... H01L 21/67034 34/107 |
| 5,575,079 | A | * | 11/1996 | Yokomizo | ......... H01L 21/67034 34/470 |
| 6,045,624 | A | * | 4/2000 | Kamikawa | ........ H01L 21/67034 15/302 |
| 6,460,552 | B1 | * | 10/2002 | Lorimer | ............ H01L 21/67051 134/147 |
| 2002/0189639 | A1 | * | 12/2002 | Aoki | ................. H01L 21/31133 257/E21.255 |
| 2003/0013310 | A1 | * | 1/2003 | Tomimori | ................. B08B 3/04 134/36 |
| 2003/0079764 | A1 | * | 5/2003 | Hirose | .............. H01L 21/67051 134/144 |
| 2010/0223805 | A1 | * | 9/2010 | Hyakutake | ........ H01L 21/67034 34/427 |
| 2012/0064705 | A1 | * | 3/2012 | Horsky | ................... H01J 37/08 392/386 |

(Continued)

FOREIGN PATENT DOCUMENTS

| | | | | |
|---|---|---|---|---|
| KR | 20070068089 | A | * | 6/2007 |
| WO | WO2022244530 | A1 | * | 11/2022 |

*Primary Examiner* — Kaj K Olsen
*Assistant Examiner* — Richard Z. Zhang
(74) *Attorney, Agent, or Firm* — Oblon, McClelland,
Maier & Neustadt, L.L.P.

(57) ABSTRACT

A wafer processing method and system are provided. The
wafer processing system includes an isopropyl alcohol (IPA)
evaporation system, an IPA condensation system, and a
process chamber. The IPA evaporation system evaporates
liquid IPA into IPA vapor. The IPA condensation system
condenses a portion of the IPA vapor into distilled high
purity liquid IPA. The process chamber rinses a semicon-
ductor wafer in the process chamber using the distilled high
purity liquid IPA, and displaces the distilled high purity
liquid IPA using a remaining portion of the IPA vapor to dry
the semiconductor wafer.

9 Claims, 2 Drawing Sheets

100

(56)  References Cited

U.S. PATENT DOCUMENTS

| | | | |
|---|---|---|---|
| 2014/0345658 A1* | 11/2014 | Maruyama | ........ H01L 21/67051 |
| | | | 134/56 R |
| 2020/0286751 A1* | 9/2020 | Koyama | ........... H01L 21/67028 |
| 2021/0265180 A1* | 8/2021 | Aibara | .............. H01L 21/02054 |
| 2024/0021445 A1* | 1/2024 | Sakurai | ............... H01L 21/6708 |

* cited by examiner

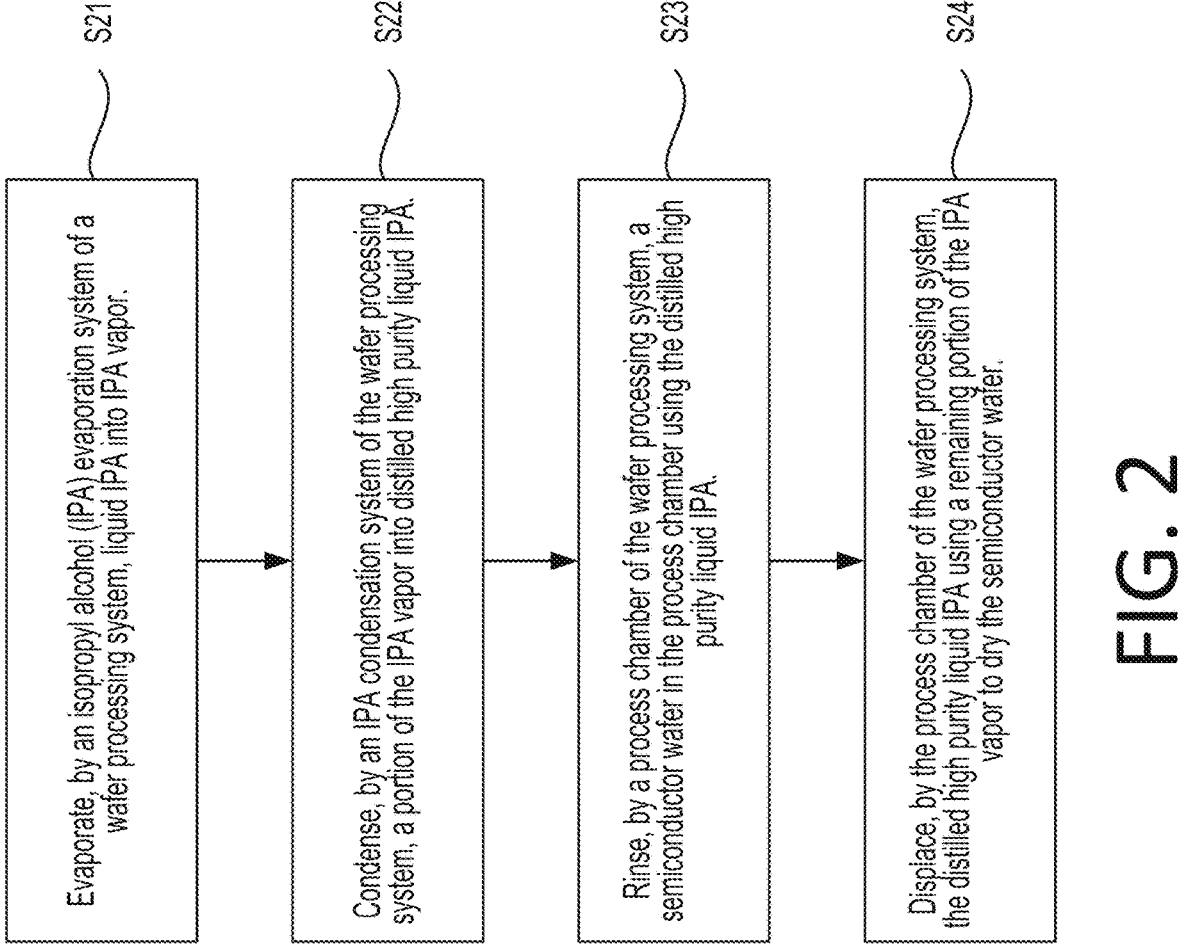

S210

Evaporate, by an isopropyl alcohol (IPA) evaporation system of a wafer processing system, liquid IPA into IPA vapor.

S220

Condense, by an IPA condensation system of the wafer processing system, a portion of the IPA vapor into distilled high purity liquid IPA.

S230

Rinse, by a process chamber of the wafer processing system, a semiconductor wafer in the process chamber using the distilled high purity liquid IPA.

S240

Displace, by the process chamber of the wafer processing system, the distilled high purity liquid IPA using a remaining portion of the IPA vapor to dry the semiconductor wafer.

WAFER CLEANING METHOD AND SYSTEM

TECHNICAL FIELD

This disclosure relates generally to the processing and surface preparation of semiconductor wafers, and particularly to a method and wafer processing system for cleaning of such wafers.

BACKGROUND

Semiconductor fabrication involves many different steps of depositing, growing, patterning, removal, and cleaning of wafers. The cleaning of the wafers can be referred to as wafer cleaning process, which includes rinsing the wafers using deionized water, displacing the deionized water with isopropyl alcohol (IPA) liquid to reduce the risks of pattern collapses on the wafers, and drying the wafers. However, the use of the IPA liquid can introduce significant particle contamination onto the wafers. Accordingly, there is a demanding need to reduce the particle contamination during the IPA supply.

SUMMARY

This disclosure provides a wafer cleaning method. In the wafer cleaning method, liquid isopropyl alcohol (IPA) is evaporated into IPA vapor by an IPA evaporation system of a wafer processing system, a portion of the IPA vapor is condensed into distilled high purity liquid IPA by an IPA condensation system of the wafer processing system, a semiconductor wafer in a process chamber of the wafer processing system is rinsed using the distilled high purity liquid IPA, and the semiconductor wafer is dried by displacing the distilled high purity liquid IPA using a remaining portion of the IPA vapor.

Aspects of the disclosure provide a wafer processing system. The wafer processing system includes an IPA evaporation system, an IPA condensation system, and a process chamber. The IPA evaporation system evaporates liquid IPA into IPA vapor. The IPA condensation system condenses a portion of the IPA vapor into distilled high purity liquid IPA. The process chamber rinses a semiconductor wafer in the process chamber using the distilled high purity liquid IPA, and displaces the distilled high purity liquid IPA using a remaining portion of the IPA vapor to dry the semiconductor wafer.

BRIEF DESCRIPTION OF DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 2 illustrates a flowchart outlining a wafer cleaning process according to an embodiment of the disclosure.

DETAILED DESCRIPTION

Figure 1:
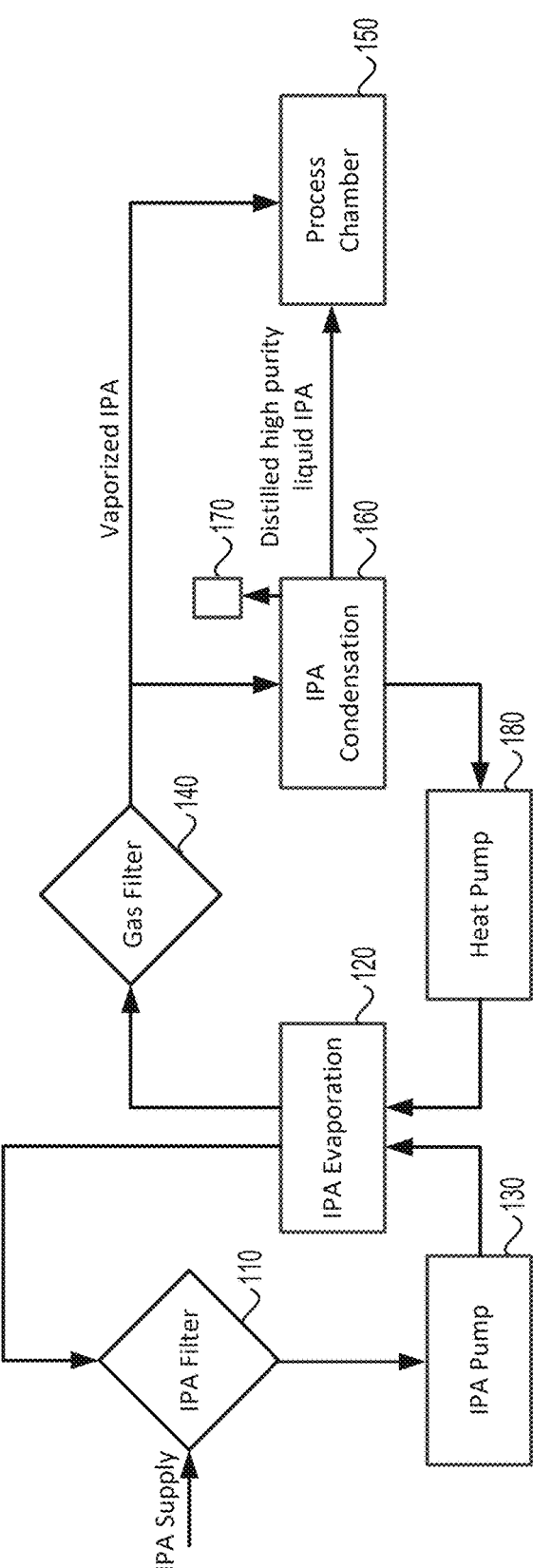
FIG. 1 illustrates a schematic of a wafer processing system according to an embodiment of the disclosure.

Reference throughout this specification to "one embodiment" or "an embodiment" means that a particular feature, structure, material, or characteristic described in connection with the embodiment is included in at least one embodiment of the application, but do not denote that they are present in every embodiment. Thus, the appearances of the phrases "in one embodiment" or "in an embodiment" in various places throughout this specification are not necessarily referring to the same embodiment of the application. Furthermore, the particular features, structures, materials, or characteristics may be combined in any suitable manner in one or more embodiments.

In semiconductor device manufacturing, a wafer cleaning process can involve rinsing a wafer surface of a semiconductor wafer using deionized water (DIW), displacing the DIW using isopropyl alcohol (IPA) to prevent pattern collapses on the semiconductor wafer, and then drying the wafer surface using a clean gas such as nitride gas. In some related arts, liquid IPA is used in the wafer cleaning process. However, since the liquid IPA is the last liquid used in the process, mechanical pumps and valves in the IPA delivery can introduce significant particle contamination into the process. Further, it is difficult to obtain a uniform removal front if using the nitride gas to displace the liquid IPA. Accordingly, there is a need to use vaporized IPA in the wafer cleaning process.

Aspects of the disclosure provide wafer cleaning methods and systems using vaporized IPA and distilled high purity liquid IPA.

According to aspects of the disclosure, a wafer cleaning process can include rinsing the semiconductor wafer using the DIW, displacing the DIW using the distilled high purity liquid IPA, displacing the distilled high purity liquid IPA using the vaporized IPA, displacing the vaporized IPA using a nitride gas, and then performing a dry process using the nitride gas to dry the semiconductor wafer. The use of the distilled high purity liquid IPA and the vaporized IPA in the wafer cleaning process can reduce the risks of particle contamination and result in a more uniform removal front.

FIG. 1 illustrates a schematic of a wafer processing system 100 according to an embodiment of the disclosure. In the wafer processing system 100, liquid IPA can be first supplied into an IPA filter 110, which can filter out at least a part of particles contained in the liquid IPA. The filtered liquid IPA can be then pumped into an IPA evaporation system 120 through an IPA pump 130. In the IPA evaporation system 120, the filtered liquid IPA can be evaporated into IPA vapor. The IPA vapor can be fed into a gas filter 140, which can further filter out any particles contained in the IPA vapor.

A portion of the filtered IPA vapor can be fed into a process chamber 150, in which a semiconductor wafer can be processed and cleaned using the portion of the filtered IPA vapor. A remaining portion of the filtered IPA vapor can be fed into an IPA condensation system 160, in which the remaining portion of the filtered IPA vapor can be condensed into distilled high purity liquid IPA. The distilled high purity liquid IPA can be fed into the process chamber 150 to clean the semiconductor wafer in the process chamber 150.

In an embodiment, to reduce the particles left in the IPA evaporation system 120 after evaporating the filtered liquid IPA into the IPA vapor, the filtered liquid IPA left in the IPA evaporation system 120 can be further fed into the IPA filter 110.

In an embodiment, the IPA condensation system 160 can include an overpressure vent 170 to prevent unwanted release of the filtered IPA vapor when the IPA condensation system 160 is in an overpressure condition.

In an embodiment, the IPA condensation system 160 can use house water such as tap water or process cooling water to condense the remaining portion of the filtered IPA vapor into the distilled high purity liquid IPA. In an example, the temperature of the wafer cleaning process needs to be maintained around a predefined temperature (e.g., 70° C.). To maintain the process temperature, the IPA condensation system 160 can include a heater.

In an embodiment, the evaporation process in the IPA evaporation system 120 needs an input heat energy while the condensation process in the IPA condensation system 160 can output a heat energy. To reduce the energy loss, a heat pump 180 can be used to transfer the heat generated from the IPA condensation system 160 to the IPA evaporation system 120. In an example, there may be a transfer loss during the heat transfer so that the transferred heat may not be enough for the IPA evaporation system 120. In such an example, a heater can be added to either the IPA condensation system 160 or the IPA evaporation system 120 to account for the transfer loss.

In an embodiment, each module such as the IPA evaporation system 120 or the IPA condensation system 160 can include an over-temperature switch.

FIG. 2 illustrates a flowchart outlining a wafer cleaning process 200 for cleaning a semiconductor wafer according to an embodiment of the disclosure. The wafer cleaning process 200 can be implemented by a wafer processing system (e.g., the wafer processing system 100). The wafer cleaning process 200 can be implemented as instructions stored in a non-transitory computer-readable medium. When executed by for example the wafer processing system, the instructions can cause the wafer processing system to perform the wafer cleaning process 200. The wafer cleaning process 200 may start at step S210.

At step S210, the wafer cleaning process 200 evaporates, by an IPA evaporation system of the wafer processing system, liquid IPA into IPA vapor. Then, the wafer cleaning process 200 proceeds to step S220.

At step S220, the wafer cleaning process 200 condenses, by an IPA condensation system of the wafer processing system, a portion of the IPA vapor into distilled high purity liquid IPA. Then, the wafer cleaning process 200 proceeds to step S230.

At step S230, the wafer cleaning process 200 rinses, by a process chamber of the wafer processing system, a semiconductor wafer in the process chamber using the distilled high purity liquid IPA. Then, the wafer cleaning process 200 proceeds to step S240.

At step S240, the wafer cleaning process 200 displaces, by the process chamber of the wafer processing system, the distilled high purity liquid IPA using a remaining portion of the IPA vapor to dry the semiconductor wafer.

In an embodiment, the wafer cleaning process 200 transfers, by a heat pump of the wafer processing system, heat energy generated from the IPA condensation system to the IPA evaporation system.

In an embodiment, the wafer cleaning process 200 rinses, by the process chamber of the wafer processing system, the semiconductor wafer using deionized water before rinsing the semiconductor wafer using the distilled high purity liquid IPA.

In an embodiment, the wafer cleaning process 200 displaces, by the process chamber of the wafer processing system, the remaining portion of the IPA vapor using a nitrogen gas to dry the semiconductor wafer.

In an embodiment, the wafer cleaning process 200 filters by a gas filter of the wafer processing system, the IPA vapor before condensing the IPA vapor.

In an embodiment, the wafer cleaning process 200 filters, by an IPA filter of the wafer processing system, the liquid IPA that is left after evaporating the liquid IPA.

In an embodiment, the wafer cleaning process 200 pumps, by an IPA pump of the wafer processing system, the filtered liquid IPA into the IPA evaporation system.

In an embodiment, the IPA condensation system includes an overpressure vent.

In an embodiment, one of the IPA evaporation system and the IPA condensation system includes a heater.

In an embodiment, one of the IPA evaporation system and the IPA condensation system includes an over-temperature switch.

Aspects of the disclosure provide a wafer processing system. The wafer processing system includes an IPA evaporation system, an IPA condensation system, and a process chamber. The IPA evaporation system evaporates liquid IPA into IPA vapor. The IPA condensation system condenses a portion of the IPA vapor into distilled high purity liquid IPA. The process chamber rinses a semiconductor wafer in the process chamber using the distilled high purity liquid IPA, and displaces the distilled high purity liquid IPA using a remaining portion of the IPA vapor to dry the semiconductor wafer.

In an embodiment, the wafer cleaning process 200 transfers, by a heat pump of the wafer processing system, heat energy generated from the IPA condensation system to the IPA evaporation system.

In an embodiment, the process chamber of the wafer processing system rinses the semiconductor wafer using deionized water before rinsing the semiconductor wafer using the distilled high purity liquid IPA.

In an embodiment, the process chamber of the wafer processing system displaces the remaining portion of the IPA vapor using a nitrogen gas to dry the semiconductor wafer.

In an embodiment, the wafer processing system includes a gas filter that filters the IPA vapor before the IPA vapor is condensed into the distilled high purity liquid IPA.

In an embodiment, the wafer processing system includes an IPA filter that filters the liquid IPA that is left after the liquid IPA is evaporated into the IPA vapor.

In an embodiment, the wafer processing system includes an IPA pump that pumps the filtered liquid IPA into the IPA evaporation system.

In an embodiment, the IPA condensation system includes an overpressure vent.

In an embodiment, one of the IPA evaporation system and the IPA condensation system includes a heater.

In an embodiment, one of the IPA evaporation system and the IPA condensation system includes an over-temperature switch.

Benefits of the methods and systems provided in this disclosure include, but are not limited to, providing a uniform front by displacing the liquid IPA using the IPA vapor, reducing the IPA amount used during the dry process, removing the source of the contamination from the wafer cleaning process by providing distilled high purity liquid IPA and IPA vapor to the wafer cleaning process, and replacing mechanical pumps with the evaporation process that provides pumping pressure and filtering at the same time.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A wafer processing system, comprising:
a heater configured to evaporate liquid IPA into IPA vapor;
a cooling system coupled to the heater, the cooling system configured to condense a portion of the IPA vapor into distilled high purity liquid IPA; and
a process chamber coupled to the heater and the cooling system, the process chamber configured to receive the distilled high purity liquid IPA from the cooling system and a remaining portion of the IPA vapor from the heater, the process chamber configured to
rinse a semiconductor wafer in the process chamber using the distilled high purity liquid IPA, and
displace the distilled high purity liquid IPA using the remaining portion of the IPA vapor to dry the semiconductor wafer,
wherein the heater and the cooling system are disposed outside the process chamber.

2. The wafer processing system of claim 1, further comprising:

a heat pump configured to transfer heat energy generated from the cooling system to the heater.

3. The wafer processing system of claim 1, wherein the process chamber is configured to rinse the semiconductor wafer using deionized water before rinsing the semiconductor wafer using the distilled high purity liquid IPA.

4. The wafer processing system of claim 1, wherein the process chamber is configured to displace the remaining portion of the IPA vapor using a nitrogen gas to dry the semiconductor wafer.

5. The wafer processing system of claim 1, further comprising:
a gas filter configured to filter the IPA vapor before the IPA vapor is condensed into the distilled high purity liquid IPA.

6. The wafer processing system of claim 1, further comprising:
an IPA filter configured to filter the liquid IPA that is left after the liquid IPA is evaporated into the IPA vapor.

7. The wafer processing system of claim 6, further comprising:
an IPA pump configured to pump the filtered liquid IPA into the heater.

8. The wafer processing system of claim 1, wherein the cooling system includes an overpressure vent.

9. The wafer processing system of claim 1, wherein one of the heater and the cooling system includes an over-temperature switch.

* * * * *